(12) United States Patent  (10) Patent No.: US 7,741,857 B2
Jagannathan et al.  (45) Date of Patent: Jun. 22, 2010

(54) SYSTEM AND METHOD FOR DE-EMBEDDING A DEVICE UNDER TEST EMPLOYING A PARAMETRIZED NETLIST

(75) Inventors: Basanth Jagannathan, Lake Zurich, IL (US); Zhenrong Jin, Essex Junction, VT (US); Hongmei Li, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 282 days.

(21) Appl. No.: 12/043,169

(22) Filed: Mar. 6, 2008

(65) Prior Publication Data

US 2009/0224772 A1  Sep. 10, 2009

(51) Int. Cl.
*G01R 35/00* (2006.01)
*G01D 18/00* (2006.01)
*G01P 21/00* (2006.01)

(52) U.S. Cl. .......................... 324/638; 324/601; 702/85

(58) Field of Classification Search .................. 324/601, 324/600, 74, 130, 202, 638, 637, 629, 649; 702/85, 104, 107
See application file for complete search history.

(56) References Cited

U.S. PATENT DOCUMENTS

| | | |
|---|---|---|
| 3,659,200 A | 4/1972 | Ota |
| 5,202,907 A | 4/1993 | Yonemoto |
| 5,586,046 A | 12/1996 | Feldbaumer et al. |
| 5,901,063 A | 5/1999 | Chang et al. |
| 5,949,694 A | 9/1999 | Amerasekera et al. |
| 6,182,269 B1 | 1/2001 | Laubhan |
| 6,211,541 B1 | 4/2001 | Carroll et al. |
| 6,472,885 B1 * | 10/2002 | Green et al. ................. 324/638 |
| 6,519,752 B1 | 2/2003 | Bakker et al. |
| 6,594,594 B1 | 7/2003 | Tsai |

(Continued)

FOREIGN PATENT DOCUMENTS

JP  2004-198111  7/2004

OTHER PUBLICATIONS

Q. Liang, et al., "A Simple Four-Port Parasitic Deembedding Methodology for High-Frequency Scattering Parameter and Noise Characterization of SiGe HBTS," IEEE Transactions on Microwave Theory and Techniques, vol. 51, No. 11, pp. 2165-2174.

*Primary Examiner*—Hoai-An D Nguyen
(74) *Attorney, Agent, or Firm*—Scully, Scott, Murphy & Presser, P.C.; Anthony J. Canale (57) ABSTRACT

S-parameter data is measured on an embedded device test structure, an open dummy, and a short dummy. A 4-port network of the pad set parasitics of the embedded device test structure is modeled by a parameterized netlist containing a lumped element network having at least one parameterized lumped element. The S-parameter data across a range of measurement frequencies is fitted with the parameterized netlist employing the at least one parameterized lumped element as at least one fitting parameter for the S-parameter data. Thus, the fitting method is a multi-frequency fitting for the at least one parameterized lumped element. A 4-port Y-parameter (admittance parameter) is obtained from the fitted parameterized netlist. The Y-parameter of the device under test is obtained from the measured admittance of the embedded device test structure and the calculated 4-port Y parameter.

20 Claims, 9 Drawing Sheets

U.S. PATENT DOCUMENTS

| | | |
|---|---|---|
| 6,594,604 B2 * | 7/2003 | Metzger et al. ............. 702/104 |
| 6,643,597 B1 * | 11/2003 | Dunsmore ................. 702/104 |
| 6,665,628 B2 | 12/2003 | Martens |
| 6,815,964 B2 | 11/2004 | Di Gregorio et al. |
| 6,832,170 B2 | 12/2004 | Martens |
| 6,961,669 B2 | 11/2005 | Brunsman |
| 7,026,829 B2 | 4/2006 | Tiemeijer |
| 7,068,049 B2 * | 6/2006 | Adamian ................... 324/638 |
| 7,071,707 B2 | 7/2006 | Tiemeijer |
| 7,075,312 B2 | 7/2006 | Fabry et al. |
| 7,157,918 B2 * | 1/2007 | Adamian ................... 324/601 |
| 2003/0115558 A1 | 6/2003 | Hilton |
| 2006/0114004 A1 | 6/2006 | Tiemeijer et al. |

\* cited by examiner

SYSTEM AND METHOD FOR DE-EMBEDDING A DEVICE UNDER TEST EMPLOYING A PARAMETRIZED NETLIST

FIELD OF THE INVENTION

The present invention relates to a system and methods for de-embedding a device under test (DUT) by employing a parameterized netlist having a parameterized lumped element.

BACKGROUND OF THE INVENTION

High frequency semiconductor devices are employed to form high frequency semiconductor circuits for communication and/or logic operations. The high frequency semiconductor devices may be a metal-oxide-semiconductor field effect transistor (MOSFET), a bipolar junction transistor (BJT), a passive device such as a capacitor or an inductor, or any other semiconductor device that requires operation at a high frequency, which is typically greater than 1 GHz.

To characterize the high frequency semiconductor devices, high frequency measurements are required. High frequency measurement on a semiconductor device requires a pad set to allow access of a probe, which may be a vector network analyzer (VNA), to the semiconductor device due to microscopic dimensions of the semiconductor device and macroscopic dimensions of the components of the probe. Thus, the probe tests the semiconductor device by transmitting signals to, and receiving signals from, the semiconductor device through the pad set. An inherent consequence of the use of the pad set is that a device test structure (DTS), or the structure tested by the probe, is not an isolated semiconductor device, which is herein referred to as an "intrinsic device" or "device under test" (DUT), but a combination of the intrinsic device and the pad set. In other words, any test data from the DUT invariably involves effects of parasitic components of the pad set that are external to the DUT. The DUT is "embedded" in the device test structure in the sense that any measurement on the intrinsic device must be performed through the entirety of the device test structure, which contains the DUT and the pad set.

Test result obtained from the device test structure includes parasitic effects of the pad set. To extract device characteristics of the DUT, the device characteristics of the inherent device need to be "de-embedded" from the measured data of the DTS since the device characteristics of the inherent device are embedded within the measured data by virtue of the embedding of the inherent device within the DTS. In general, the pad set introduces significant parasitic effects at high measurement frequencies.

Figure 1:
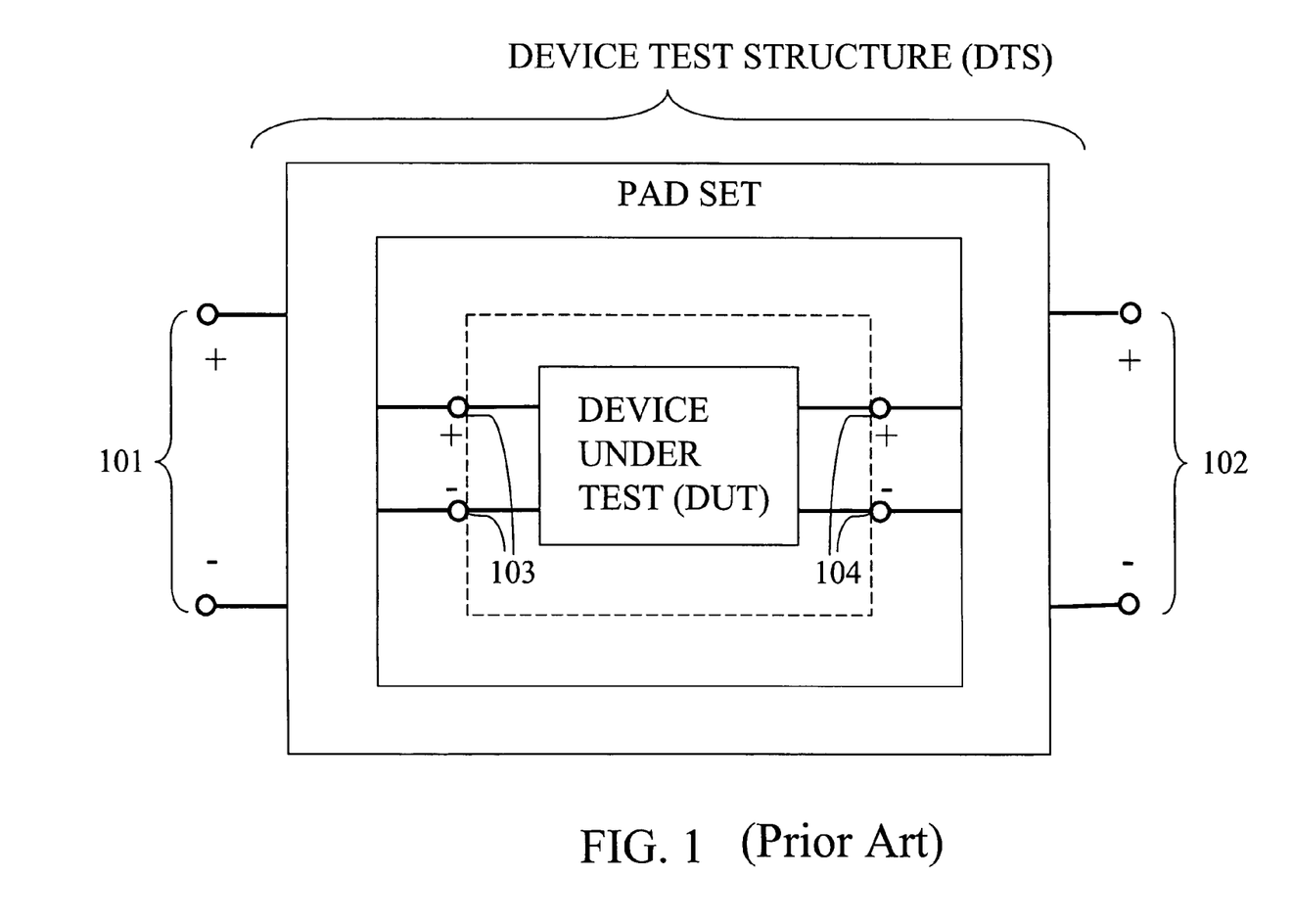
FIG. 1 is a device test structure (DTS) containing an embedded device under test (DUT) and a pad set.

Referring to FIG. 1, a DTS containing a DUT and a pad set is shown. If each of the DTS and the DUT is treated as a 2-port network respectively, the pad set that generates the parasitic effect on the intrinsic device is a 4-port network. The electrical effect of the pad set is herein referred to as the "pad set parasitics." The first port 101 of the 4-port network comprises a port of the DTS. The second port 102 of the 4-port network comprises another port of the DTS. The third port 103 of the 4-port network comprises a connection point to the DUT. The fourth port 104 of the 4-port network comprises another connection point to the DUT.

Unfortunately, the 4-port network and the DUT are unknown. All measurement data is based on measurement on the DTS as a whole. To facilitate de-embedding of the measurement data, calibration standards are used to estimate and subtract the effects of the pad set parasitics of the 4-port network. Exemplary calibration standards include an "open dummy" or an "open network," a "short dummy" or a "short network," a "thru dummy" or a "thru network," the structures and netlist representations of which are described in Table 1.

TABLE 1

Physical structures and netlist representations of common dummies in prior art de-embedding methods

| Type of calibration standard | Physical structure | Netlist representation |
|---|---|---|
| Thru dummy | DUT removed from DTS and the third port 103 and the fourth port 104 are connected | 4-port network with the third port 103 and the fourth port 104 directly connected |
| Open dummy | DUT removed from DTS | 4-port network with the third port 103 and the fourth port 104 open |
| Short dummy | DUT removed from DTS and the third port 103 and the fourth port 104 are shorted | 4-port network with the third port 103 and the fourth port 104 shorted |

Traditionally, de-embedding is performed in two steps. Commonly used prior art de-embedding method is open-short (O-S) de-embedding, which requires two additional calibration standards of an open dummy and a short dummy. The open-short de-embedding simplifies the 4-port network by assuming that dominant parasitics are either near the probe pad or near the DUT, and are not distributed.

Figure 2:
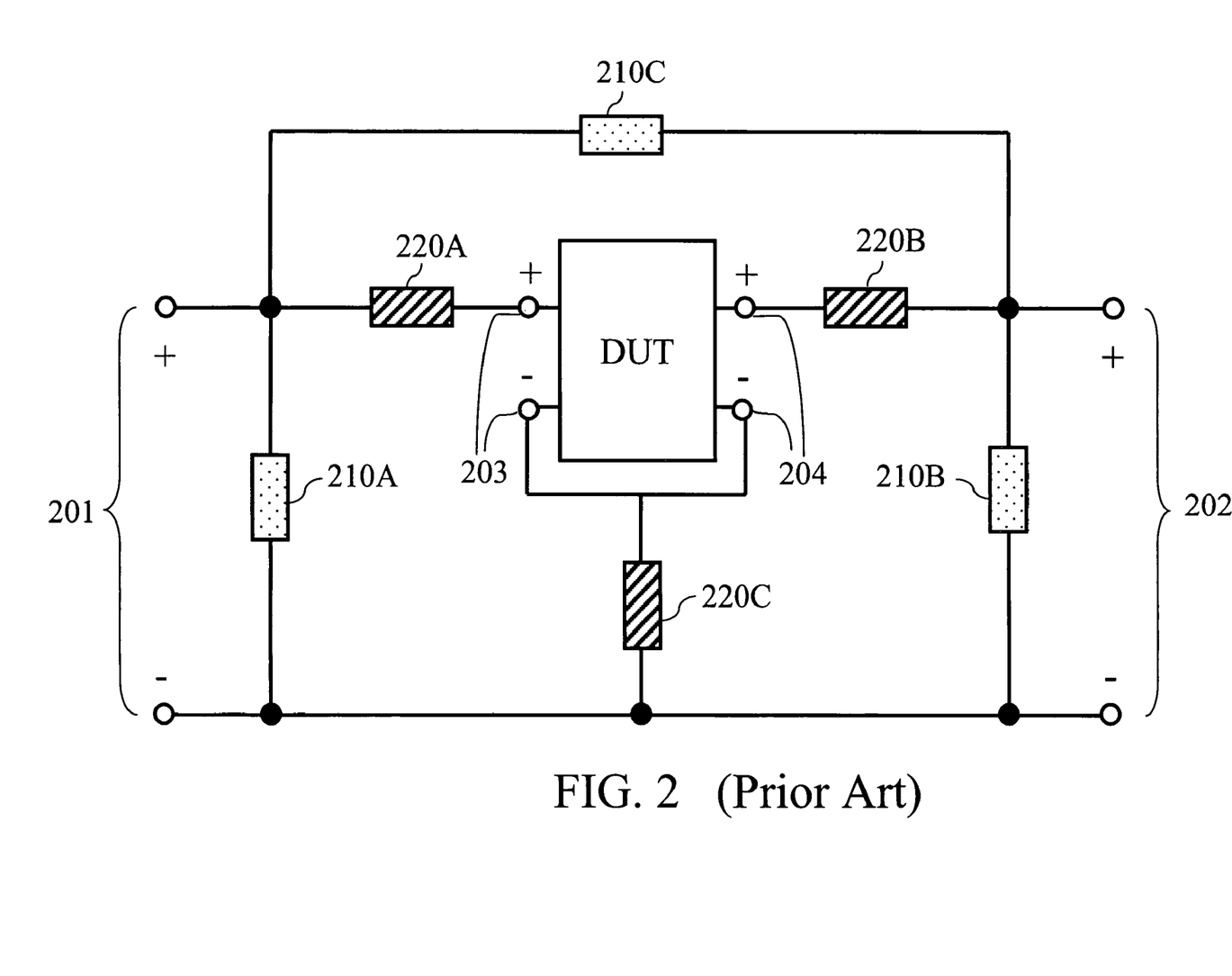
FIG. 2 is an equivalent circuit for a 4-port network according to a prior art open-short (O-S) de-embedding method.

Referring to FIG. 2, an equivalent circuit for the 4-port network according to the O-S de-embedding method is shown. The equivalent circuit according to the O-S de-embedding comprises a first open parasitics component 210A, a second open parasitics component 210B, and a third open parasitics component 210C. The first open parasitics component 210A is connected directly between the two nodes of the first port 201 of the 4-port network, which is a first port of the DTS. The second open parasitics component 210B is connected directly between the two nodes of the second port 202 of the 4-port network, which is a second port of the DTS. The third open parasitics component 210C is connected between a signal node (marked with a "+" sign, as opposed to a ground node that is marked with a "−" sign) of the first port 201 of the 4-port network and a signal node of the second port of the 4-port network.

The equivalent circuit according to the O-S de-embedding further comprises a first short parasitics component 220A, a second short parasitics component 220B, and a third short parasitics component 220C. The first short parasitics component 220A is connected directly between the signal node of the first port 201 of the 4-port network and a signal node of the third node 203 of the 4-port network, which is a first port of the DUT. The second short parasitics component 220B is connected directly between the signal node of the second port 202 of the 4-port network and a signal node of the fourth node 204 of the 4-port network, which is a second port of the DUT. The third short parasitics component 220C is connected directly between the combined ground nodes (between which no parasitic components are assumed to be present in the O-S de-embedding method) of the third and fourth ports (203, 204) of the 4-port network and the combined ground nodes (between which no parasitic components are assumed to be present in the O-S de-embedding method) of the first and second ports (201, 202) of the 4-port network.

Figure 3:
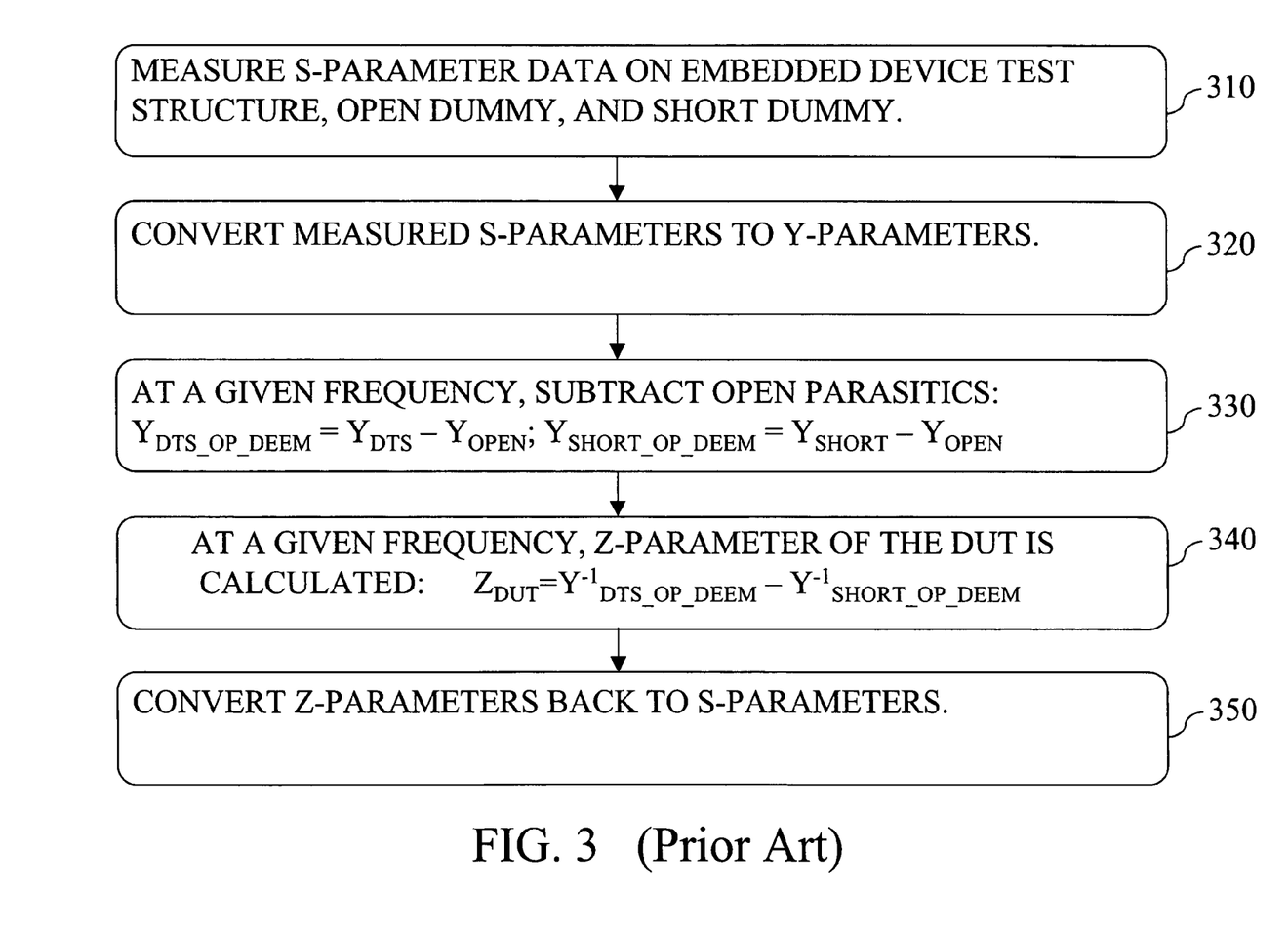
FIG. 3 is a flow chart illustrating the prior art open-short (O-S) de-embedding method.

Referring to FIG. 3, a prior art open-short (O-S) de-embedding method is shown in a flow chart. Referring to step 310, scattering parameter (S-parameter) data is measured on the embedded device test structure containing the device under test (DUT) and the pad set. Scattering parameters are parameters that describe electrical behavior of a linear electrical network subjected to steady state stimuli by small electrical signals. In general, various electrical properties of the linear electrical network such as signal gain, return loss, voltage standing wave ratio, refection coefficient, and amplifier stability may be described with S-parameters. The idea behind the S-parameters is that the response of the linear electrical network may be considered as scattering of an input signal within the linear electrical network. Of particular concern for estimating the pad set parasitics with the prior art O-S de-embedding method are Y-parameters that represent admittance of the 4-port network and Z-parameters that represent impedance of the 4-port network.

Referring to step 320, the measured S-parameters are converted to Y-parameters. Methods of converting S-parameters to Y-parameters in a 2-port network are known in the art. Specifically, U.S. Pat. No. 7,075,312 to Fabry et al., U.S. Pat. Nos. 7,026,829 and 7,071,707 to Tiemeijer, U.S. Pat. No. 6,961,669 to Brunsman, U.S. Pat. Nos. 6,832,170 and 6,665,628 to Martens, U.S. Pat. No. 6,815,964 to Di Gregorio et al., and U.S. Pat. No. 6,211,541 to Carroll et al. are incorporated herein. It is noted that the S-parameters, Y-parameters, and Z-parameters of a 2-port network are given by 2×2 matrices.

Referring to step 330, calculations for subtracting open parasitics, i.e., the collective parasitics of the first open parasitics component 210A, the second open parasitics component 210B, and the third open parasitics component 210C, are performed at a predetermined frequency. The first operation calculates an open de-embedded DTS admittance $Y_{DTS\_OP\_DEEM}$, which is the admittance of the set of the DUT and the short parasitics, i.e., the collective parasitics of the first short parasitics component 220A, the second short parasitics component 220B, and the third short parasitics component 220C. The open de-embedded DTS admittance, $Y_{DTS\_OP\_DEEM}$ is given by:

$$Y_{DTS\_OP\_DEEM} = Y_{DTS} - Y_{OPEN}, \quad \text{(Equation 1)}$$

wherein $Y_{DTS}$ is the calculated admittance of the DTS that contains the DUT, the open parasitics, and the short parasitics, and wherein $Y_{OPEN}$ is the calculated admittance of an open dummy that is supposed to contain only the open parasitics. The calculated admittance of the DTS $Y_{DTS}$ and the calculated admittance of the open dummy, $Y_{OPEN}$ are based on the S-parameters of the DTS and the open dummy that are measured at the predetermined frequency.

The second operation calculated a short de-embedded DTS admittance $Y_{SHORT\_OP\_DEEM}$, which is the admittance of the short parasitics that contains the collective parasitics of the first short parasitics component 220A, the second short parasitics component 220B, and the third short parasitics component 220C. The short de-embedded DTS admittance, $Y_{SHORT\_OP\_DEEM}$ is given by:

$$Y_{SHORT\_OP\_DEEM} = Y_{SHORT} - Y_{OPEN}, \quad \text{(Equation 2)}$$

wherein $Y_{SHORT}$ is the calculated admittance of a short dummy that is supposed to contain the open parasitics and the short parasitics. The calculated admittance of the short dummy, $Y_{SHORT}$ is based on the S-parameters of the short dummy that are measured at the predetermined frequency.

Referring to step 340, a DUT Z-parameter, which is the Z-parameter of the DUT, is calculated. The DUT Z-parameter $Z_{DUT}$ is given by:

$$Z_{DUT} = Y^{-1}_{DTS\_OP\_DEEM} - Y^{-1}_{SHORT\_OP\_DEEM}, \quad \text{(Equation 3)}$$

wherein $Y^{-1}_{DTS\_OP\_DEEM}$ is the inverse matrix of the open de-embedded DTS admittance $Y_{DTS\_OP\_DEEM}$ and $Y^{-1}_{SHORT\_OP\_DEEM}$ is the inverse matrix of the short de-embedded DTS admittance, $Y_{SHORT\_OP\_DEEM}$.

Referring to step 350, the DUT Z-parameter $Z_{DUT}$ is converted back to an S parameter. It is noted that the manipulation of measured S-parameters is done for the preset frequency and that there is no fitting or any variable parameter in the prior art O-S de-embedding method. Thus, execution of one round of the calculation process provides DUT Z-parameter $Z_{DUT}$ at one frequency. To generate a frequency dependent profile for DUT Z-parameter $Z_{DUT}$, the calculation process is repeated at multiple frequencies one frequency at a time.

While the open-short (O-S) de-embedding method provides a simple scheme for estimating the pad set parametrics, the assumption on dominant parametrics and nature of distribution of the pad set parametrics is not true in many cases, and introduces significant errors especially at high frequency, e.g., in GHz frequency ranges and above. This problem becomes more profound in noise de-embedding particularly in bulk complementary metal-oxide-semiconductor (CMOS) technology, which employs a bulk substrate that induces a large signal loss.

Some other de-embedding techniques have been proposed in the prior art to enhance accuracy of estimation of the 4-port network representing the pad set parasitics. For example, a "three step" de-embedding method employing 3 calibration standards and assuming a 9 element network for the 4-port network is known in the art. U.S. Patent Application Publication No. 2006/0114004 A1 to Tiemeijer that discloses the three step de-embedding method is herein incorporated by reference. A 4-port de-embedding method employing 4 to 6 calibration standards and assuming a 15 element network for the 4-port network is also known in the art. Q. Liang, et al., "A Simple Four-Port Parasitic Deembedding Methodology for High-Frequency Scattering Parameter and Noise Characterization of SiGe HBTs," IEEE Trans. Microwave Theory and Techniques, v. 51, n. 11, pp. 2165-2174 (2003) that discloses the complete de-embedding method is herein incorporated by reference. However, use of additional calibration standards to enhance accuracy of the de-embedding increases device characterization cost both by increasing a total test structure area on a semiconductor chip and by increasing the complexity of testing and data analysis. While benefits of use of increased number of calibration standards are known, the prior art methods also incur significant increase in cost, oftentimes rendering the characterization methods uneconomical.

In view of the above, there exists a need for an improved system and methods for representing the 4-port network of the pad set with an enhanced accuracy in the estimation of the of the pad set parasitics.

Further, there exists a need for an improved system and methods for de-embedding a device test structure in which a device under test (DUT) is embedded to extract device characteristics of the DUT with an enhanced accuracy.

SUMMARY OF THE INVENTION

The present invention addresses the needs described above by providing at least one parameterized lumped element in a model for the 4-port network that represents the pad set parametrics, which is then fitted with measured S parameters at multiple frequencies to determine the values of the at least one parameterized lumped element.

In the present invention, S-parameter data is measured on an embedded device test structure, an open dummy, and a short dummy. A 4-port network of the pad set parasitics of the embedded device test structure is modeled by a parameterized netlist containing a lumped element network having at least one parameterized lumped element. The S-parameter data across a range of measurement frequencies is fitted with the parameterized netlist employing the at least one parameterized lumped element as at least one fitting parameter for the S-parameter data. Thus, the fitting method is a multi-frequency fitting for the at least one parameterized lumped element. A 4-port Y-parameter (admittance parameter) is obtained from the fitted parameterized netlist. The Y-parameter of the device under test is obtained from the measured admittance of the embedded device test structure and the calculated 4-port Y parameter.

According to an aspect of the present invention, a system for extracting pad set parasitics from a device test structure (DTS) is provided. The system comprises:

the DTS embedding a device under test (DUT);

at least one calibration standard for the DUT;

scattering parameter (S-parameter) measurement means for measuring S-parameters of the DTS and the at least one calibration standard at multiple frequencies;

a parameterized netlist representing the pad set parasitics and containing a lumped element network having at least one parameterized lumped element;

S-parameter fitting means for fitting measured S-parameters of the DTS and the at least one calibration standard with the at least one parameterized lumped element; and 4-port Y-parameter calculation means for calculating a 4-port Y-parameter of the parameterized netlist from a fitted parameterized lumped element value for each of the at least one parameterized lumped element.

4-port de-embedding calculation means for extracting a 2-port Y-parameter of the DUT using the 4-port Y-parameter of the parameterized netlist.

In one embodiment, the S-parameter fitting means fits the measured S-parameters of the DTS and the at least one calibration standard at the multiple frequencies with the at least one parameterized lumped element.

In another embodiment, the at least one parameterized lumped element comprises at least one of a resistor, a capacitor, an inductor, a voltage source, a current source, and a transmission line.

In even another embodiment, each of the at least one parameterized lumped element has a frequency independent resistance variable, a frequency dependent resistance variable, a frequency independent inductance variable, a frequency dependent inductance variable, a frequency independent capacitance variable, a frequency dependent capacitance variable, a frequency independent voltage variable, a frequency dependent voltage variable, a frequency independent current variable, a frequency independent current variable, a frequency independent transmission line variable, or a frequency dependent transmission line variable.

In yet another embodiment, an initial value, a lower bound, and an upper bound are provided for each of the at least one parameterized lumped element for the fitting of the measured S-parameters.

In still another embodiment, the at least one calibration standard comprises an open dummy and a short dummy.

In still yet another embodiment, the system comprises DUT Y-parameter calculation means for calculating a Y-parameter of the DUT based on the measured S-parameters of the DTS and the 4-port Y-parameter of the parameterized netlist.

In a further embodiment, each of the S-parameter fitting means and the 4-port Y-parameter calculation means is a computer program.

In a yet further embodiment, each component of the 4-port Y-parameter of the parameterized netlist is given by an analytic function having frequency dependence, i.e., varying with frequency.

According to another aspect of the present invention, a system for extracting a device parameter of a device under test (DUT) embedded in a device test structure (DTS) is provided. The system comprises:

the DTS embedding the device under test (DUT);

at least one calibration standard for the DUT;

scattering parameter (S-parameter) measurement means for measuring S-parameters of the DTS and the at least one calibration standard at multiple frequencies;

a parameterized netlist containing a first lumped element network and a second lumped element network, wherein the first lumped element network represents pad set parasitics of the DTS and has at least one first parameterized lumped element, and wherein the second lumped element network represents the DUT and has at least one second parameterized lumped element;

S-parameter fitting means for fitting measured S-parameters of the DTS and the at least one calibration standard with the at least one first parameterized lumped element and the at least one second parameterized lumped element; and DUT parameter extraction means for calculating the device parameter from fitted parameterized lumped element values for each of the at least one first parameterized lumped element and the at least one second parameterized lumped element.

In one embodiment, the system further comprises 4-port Y-parameter calculation means for calculating a 4-port Y-parameter of the parameterized netlist from fitted parameterized lumped element values for each of the at least one first parameterized lumped element and the at least one second parameterized lumped element. Each component of the 4-port Y-parameter of the parameterized netlist is given by an analytic function having frequency dependence.

In another embodiment, the S-parameter fitting means fits the measured S-parameters of the DTS and the at least one calibration standard at the multiple frequencies with the at least one first parameterized lumped element and the at least one second parameterized lumped element.

In even another embodiment, each of the at least one first parameterized lumped element and the at least one second parameterized lumped element comprises at least one of a resistor, a capacitor, an inductor, a voltage source, a current source, and a transmission line.

In yet another embodiment, each of the at least one first parameterized lumped element and the at least one second parameterized lumped element has a frequency independent resistance variable, a frequency dependent resistance variable, a frequency independent inductance variable, a frequency dependent inductance variable, a frequency independent capacitance variable, a frequency dependent capacitance variable, a frequency independent voltage variable, a frequency dependent voltage variable, a frequency independent current variable, a frequency independent current variable, a frequency independent transmission line variable, or a frequency dependent transmission line variable.

In still another embodiment, an initial value, a lower bound, and an upper bound are provided for each of the at least one first parameterized lumped element and the at least one second parameterized lumped element for the fitting of the measured S-parameters.

In still yet another embodiment, the at least one calibration standard comprises an open dummy and a short dummy.

In a further embodiment, the DUT parameter extraction means calculating a Y-parameter of the DUT based on the measured S-parameters of the DTS and the fitted parameterized lumped element values.

In a yet further embodiment, each of the S-parameter fitting means and the DUT parameter extraction means is a computer program.

According to even another aspect of the present invention, a method for extracting pad set parasitics from a device test structure (DTS) is provided. The method comprises:

providing the DTS embedding a device under test (DUT);

providing at least one calibration standard for the DUT;

measuring S-parameters of the DTS and the at least one calibration standard at multiple frequencies;

generating a parameterized netlist representing the pad set parasitics and containing a lumped element network having at least one parameterized lumped element;

fitting measured S-parameters of the DTS and the at least one calibration standard with the at least one parameterized lumped element;

calculating a 4-port Y-parameter of the parameterized netlist from a fitted parameterized lumped element value for each of the at least one parameterized lumped element; and calculating a 2-port Y-parameter of the DUT using the 4-port Y-parameter of the parameterized netlist.

In one embodiment, the S-parameter fitting means fits the measured S-parameters of the DTS and the at least one calibration standard at the multiple frequencies with the at least one parameterized lumped element.

In another embodiment, the method further comprises calculating a Y-parameter of the DUT based on the measured S-parameters of the DTS and the 4-port Y-parameter of the parameterized netlist.

In yet another embodiment, a first computer program is employed for fitting the measured S-parameters and a second computer program is employed for calculating the 4-port Y-parameter of the parameterized netlist.

According to yet another aspect of the present invention, a method for extracting a device parameter of a device under test (DUT) embedded in a device test structure (DTS) is provided. The method comprises:

providing the DTS embedding the device under test (DUT);

providing at least one calibration standard for the DUT;

measuring S-parameters of the DTS and the at least one calibration standard at multiple frequencies;

generating a parameterized netlist containing a first lumped element network and a second lumped element network, wherein the first lumped element network represents pad set parasitics of the DTS and has at least one first parameterized lumped element, and wherein the second lumped element network represents the DUT and has at least one second parameterized lumped element;

fitting measured S-parameters of the DTS and the at least one calibration standard with the at least one first parameterized lumped element and the at least one second parameterized lumped element; and calculating the device parameter from fitted parameterized lumped element values for each of the at least one first parameterized lumped element and the at least one second parameterized lumped element.

In one embodiment, the method further comprises calculating a 4-port Y-parameter of the parameterized netlist from fitted parameterized lumped element values for each of the at least one first parameterized lumped element and the at least one second parameterized lumped element.

DETAILED DESCRIPTION OF THE INVENTION

As stated above, the present invention relates to a system and methods for de-embedding a device under test (DUT) by employing a parameterized netlist having a parameterized lumped element, which are now described in detail with accompanying figures. It is noted that like and corresponding elements mentioned herein and illustrated in the drawings are referred to by like reference numerals.

Figure 4:
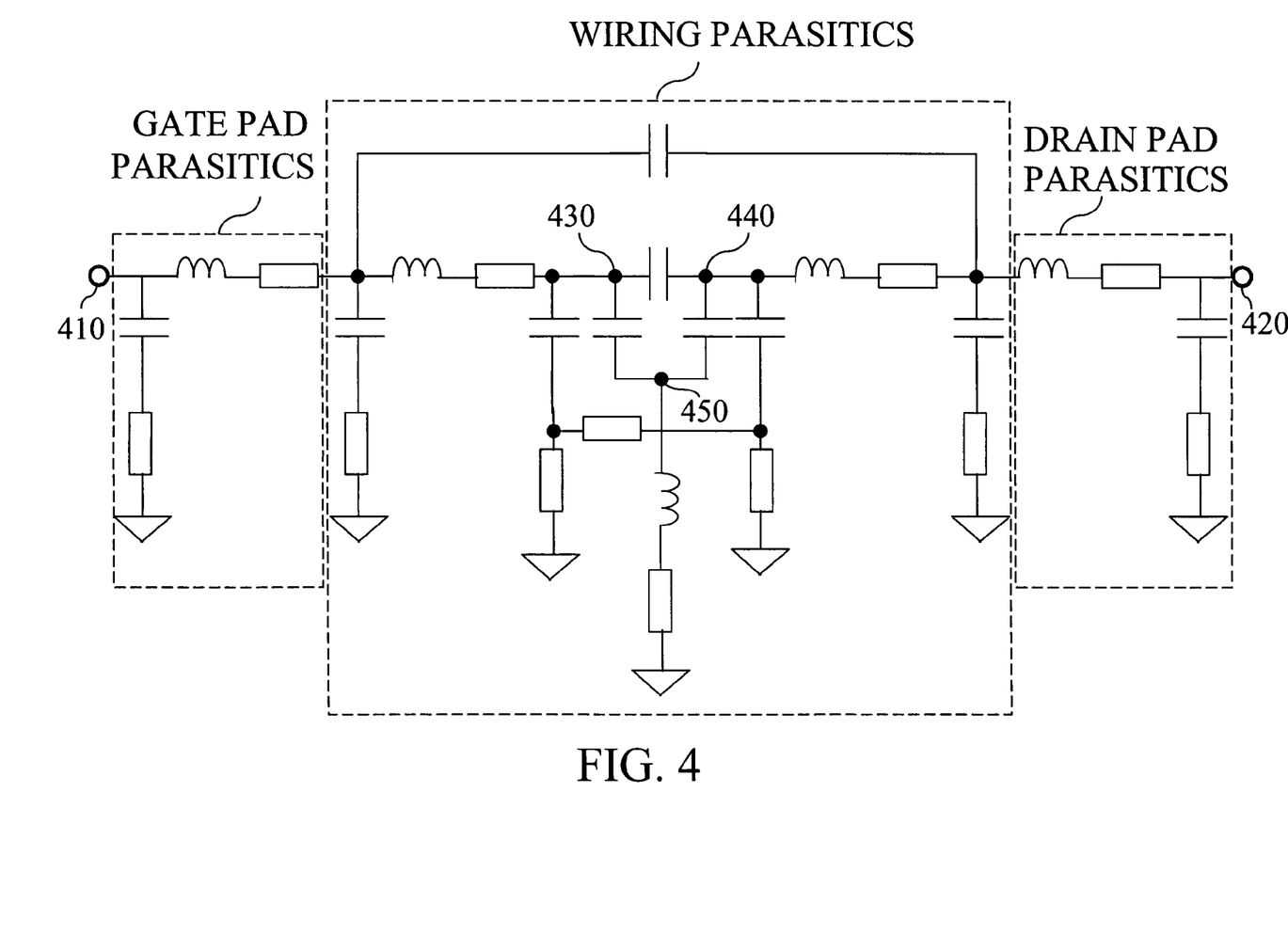
FIG. 4 is an exemplary equivalent circuit for pad set parasitics according to the present invention.

Referring to FIG. 4, an exemplary equivalent circuit for pad set parasitics according to the present invention comprises at least one parameterized lumped element, each of which may be a resistor, a capacitor, an inductor, a current source, a voltage source, a transmission line, and any other lumped element. In general, a lumped element model employs lumped elements and perfectly conducting connections between the lumped elements to generate a lumped element network that approximates an electronic circuit. This is in contrast with a distributed element model, or a transmission line model, which employs distributed elements that are infinitesimal in size and connected by wires that have a finite impedance to generate a distributed element network that approximates an electronic circuit or a transmission line. For the purposes of the present invention, the exemplary equivalent circuit is a parameterized lumped element network for the pad set parasitics.

At least one of the lumped elements in the exemplary equivalent circuit is a parameterized lumped element, i.e., a lumped element that is parameterized and having a variable value that may be changed and/or fitted. The exemplary equivalent circuit may also contain some constant lumped elements, i.e., lumped elements that are not parameterized and have a constant value. The at least one parameterized lumped element may comprise a resistor having a parameterized frequency independent/dependent resistance value, a capacitor having a parameterized frequency independent/dependent capacitance value, and/or an inductor having a parameterized frequency independent/dependent inductance value. A constant lumped element, if present, may comprise a resistor having a constant frequency independent/dependent resistance value, a capacitor having a constant frequency independent/dependent capacitance value, and/or an inductor having a constant frequency independent/dependent inductance value.

Specifically, the exemplary equivalent circuit in FIG. 4 comprises 12 resistors, 10 capacitors, and 5 inductors between a first signal node 410 of a first port, a second signal node 420 of a second port, a gate node 430 of a transistor (not shown), a drain node 440 of the transistor, and a source node 450 of the transistor. In this case, the transistor is a device under test (DUT). The exemplary equivalent circuit contains gate pad parasitics which are parasitic components of a physical gate pad structure, and drain pad parasitics which are parasitic components of a physical drain pad structure. The exemplary equivalent circuit also contains wiring parasitics which are parasitic components of the device test structure (DTS) due to wiring components of the pad set excluding the physical gate pad structure and the physical drain pad structure. For example, the wiring components include all back-end-of-line wiring structures beneath the physical gate pad structure and the physical drain pad structure. The DTS comprises the pad set and the DUT. The present invention is not limited by the exemplary equivalent circuit, and may be practiced with any model for the pad set parasitics that contains at least one parameterized lumped element.

Any subset of the 12 resistors, 10 capacitors, and 5 inductors in the exemplary equivalent circuit may be the at least one parameterized lumped element. Thus, the number of the at least one parameterized lumped element may be 1 or any number up to the total number of the parameterized lumped elements and the constant lumped elements in the exemplary equivalent circuit. Each of the parameterized lumped element has a frequency independent resistance variable, a frequency independent inductance variable, or a frequency independent capacitance variable.

Figure 5:
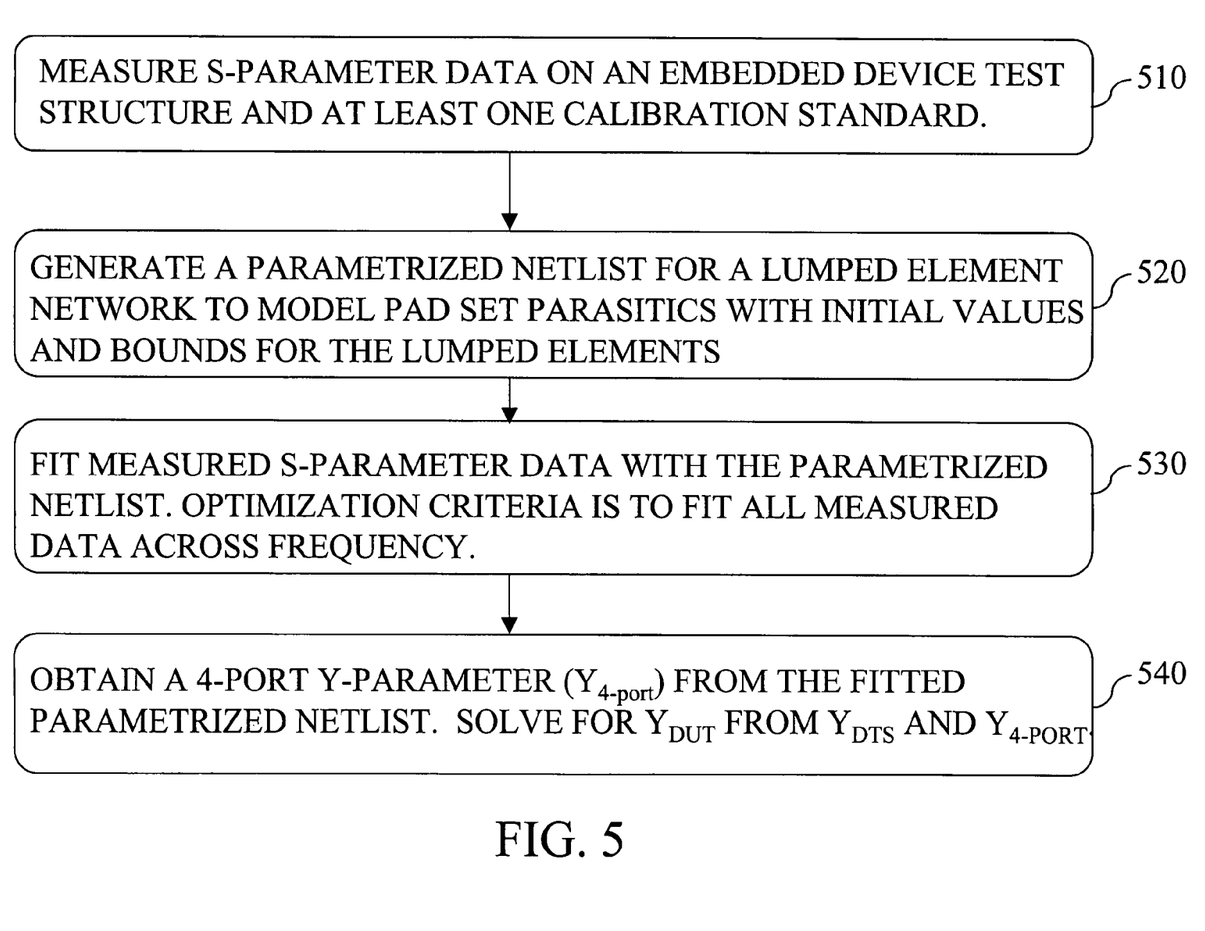
FIG. 5 is a flow chart illustrating a method for extracting pad set parasitics from a device test structure (DTS) according to an aspect of the present invention.

Referring to FIG. 5, a flow chart illustrating a method for extracting pad set parasitics from a device test structure (DTS) according to a first embodiment of the present invention is shown. The DTS embeds a device under test (DUT) and contains a pad set having pad set parasitics that may be modeled with a lumped element model having at least one parameterized lumped element as described above.

Referring to step 510, scattering parameter (S-parameter) data is measured on the DTS that embeds the DUT. Further, scattering parameter data is also measured on at least one calibration standard, which includes at least one of an open dummy, a short dummy, and a thru dummy. Preferably, the at least one calibration standard includes the open dummy and the short dummy. The S-parameter measurements on the DTS and the at least one calibration standard are performed at multiple frequencies employing a test equipment such as a vector network analyzer (VNA). The measurement frequencies may be at or above 1 GHz.

Referring to step 520, a parameterized netlist containing a lumped element network for the pad set parasitics of the DTS and representing the pad set parasitics of the DTS is generated. For example, the parameterized netlist may represent the exemplary equivalent circuit of FIG. 4, which is a parameterized lumped element network for the pad set parasitics of a DTS. The lumped element network is a parameterized lumped element network since at least one of the lumped elements in the lumped element network is parameterized, i.e., is a variable that may be changed and/or fitted.

An exemplary parameterized netlist for the pad set parasitics of the DTS in FIG. 4 is shown below.

An exemplary parameterized netlist:
```
*Define data file name. Format:
*$OPEN OpenDataFileName
$OPEN NfLvt3xp08x40O3
$SHORT NfLvt3xp08x40S3
$DEVICE1 NfLvt3xp08x40_3
*Other possible dummies
*$OPEN2
*$THRU
*$OPENSHORT
*$SHORTOPEN
*$RESSHORT
*$SHORTRES
*$RESTHRU
*$RESOPEN
*$OPENRES
*$DEVICE1
*$DEVICE2
*$DEVICE3
BEGIN COMMON
C18 1 8 1.98438e-14 10e-15 100e-15
C29 2 9 2.34375e-14 10e-15 100e-15
R80 8 801 89 10 100
R90 9 901 55 10 100
L80 801 0 8.875e-12 1e-12 16e-12
L90 901 0 3.5625e-12 1e-12 16e-12
C800 8 0 4.9375e-16 1e-16 1.6e-15
C900 9 0 1.3625e-15 1e-16 1.6e-15
L13 1 13 5.45313e-11 50e-12 200e-12
L24 2 24 5.04688e-11 50e-12 200e-12
R13 13 3 0.750001 0 1
R24 24 4 0.031251 0 1
C36 3 6 3.9375e-14 10e-15 100e-15
C47 4 7 4.5625e-14 10e-15 100e-15
R60 6 601 7 0 100
R70 7 701 0.359376 0 100
L60 601 0 9.75e-12 1e-12 16e-12
L70 701 0 7.8125e-12 1e-12 16e-12
C600 6 0 1.25e-15 1e-16 1.6e-15
C700 7 0 1.09375e-16 1e-16 1.6e-15
L0 5 50 1.2e-11 1e-12 16e-12
R0 50 0 0.156251 0 1
R67 6 7 32 1 255
BEGIN OPEN
Cc341 3 4 1.5875e-15 1e-15 255e-15
Cc351 3 5 1.0125e-15 1e-15 255e-15
Cc451 4 5 1.0875e-15 1e-15 255e-15
```

BEGIN SHORT
Rs35 3 5 0.187501 0 1
Rs45 4 5 0.218751 0 1

Preferably, an initial value, a lower bound, and an upper bound are provided for each of the at least one parameterized lumped element in the parameterized netlist for future fitting purposes. For example, in the first exemplary parameterized netlist described above, the parameterized lumped element C18 (shown in the first line of code after "BEGIN COMMON" line) contains an initial value of 1.98438e-14, a lower bound of 10e-15, and an upper bound of 100e-15. The presence of a lower bound and an upper bound for each of the at least one parameterized lumped element helps facilitate convergence of fitting of S-parameter data in subsequent steps.

The parameterized netlist may contain some constant lumped elements, i.e., lumped elements having a constant value for resistance, capacitance, or inductance. As described above, the at least one parameterized lumped element may comprise a resistor having a parameterized frequency independent resistance value, a capacitor having a parameterized frequency independent capacitance value, and/or an inductor having a parameterized frequency independent inductance value. A constant lumped element, if present, may comprise a resistor having a constant frequency independent resistance value, a capacitor having a constant frequency independent capacitance value, and/or an inductor having a constant frequency independent inductance value.

Referring to step 530, the measured S-parameter data from the DTS and the at least one calibration standard is fitted with the parameterized netlist employing the at least one parameterized lumped element as a set of at least one fitting parameter. A genetic algorithm for fitting data may be employed. A genetic algorithm performs iterative calculations to induce convergence of a total fitting error to a minimum value.

According to the present invention, the fitting is performed across all measurement frequencies. Thus, the collective set of the S-parameter data on the DTS and the at least one calibration standard across all measurement frequencies is fitted with the parameterized netlist. In principle, as long as the total number of independent measurement data points in the collective set of the S-parameter data exceeds the total number of the at least one parameterized lumped element, a complete set of values may be obtained for all of the at least one parameterized lumped element. Since the number of measurement frequencies may be increased without limit, a parameterized netlist having any positive integer for the number of the at least one parameterized lumped element may be fitted by increasing the number of measurement frequencies for the collective set of the S-parameter data on the DTS and the at least one calibration standard. In practice, the number of the at least one parameterized lumped element is optimized to facilitate fitting of the collective set of the S-parameter data on the DTS and the at least one calibration standard with a high confidence level.

The collective set of the S-parameter data on the DTS and the at least one calibration standard across all measurement frequencies is employed simultaneously for fitting of the at least one parameterized lumped element. Each of the at least one parameterized lumped element is simultaneously fitted with the rest of the at least one parameterized lumped element as the generic algorithm simultaneously fits the collective set of the S-parameter data. In other words, an optimization criteria for the set of the at least one parameterized lumped element is to fit all measured S-parameter data across all measured frequency. A computer program may be employed to obtain an optimal fitted value, or a fitted parameterized lumped element value, for each of the at least one parameterized lumped element.

Referring to step 540, a 4-port Y-parameter for the lumped element network of the pad set parasitics is calculated from the parameterized netlist and the set of at least one optimal fitted value. The lumped element network has a fixed value, which is the optimal fitted value, for each of the lumped components within the lumped element network. Each of the constant lumped elements, if any is present, in the lumped element network has a constant value for the resistance, capacitance, or inductance of the constant lumped element. Each of the at least one parameterized lumped element in the lumped element network has the optimal fitted value for the resistance, capacitance, or inductance of the parameterized lumped element.

Thus, the values of all lumped components are known for the parameterized lumped element network that is represented by the parameterized netlist after the fitting of the collective set of the S-parameter data. The pad set parasitics may be represented by a frequency dependent formula for each component of the 4-port Y-parameter of the parameterized netlist, which is now provided with a fitted value for each of the parameterized lumped element. Thus, each component of the 4-port Y-parameter for the pad set parasitics according to the present invention is given by an analytic function having frequency dependence that may be interpolated and extrapolated by an analytic function outside the range of measurement frequencies. An analytic function is a function that is locally given by a convergent power series. The analytic function may be a power series of frequency.

Figure 6:
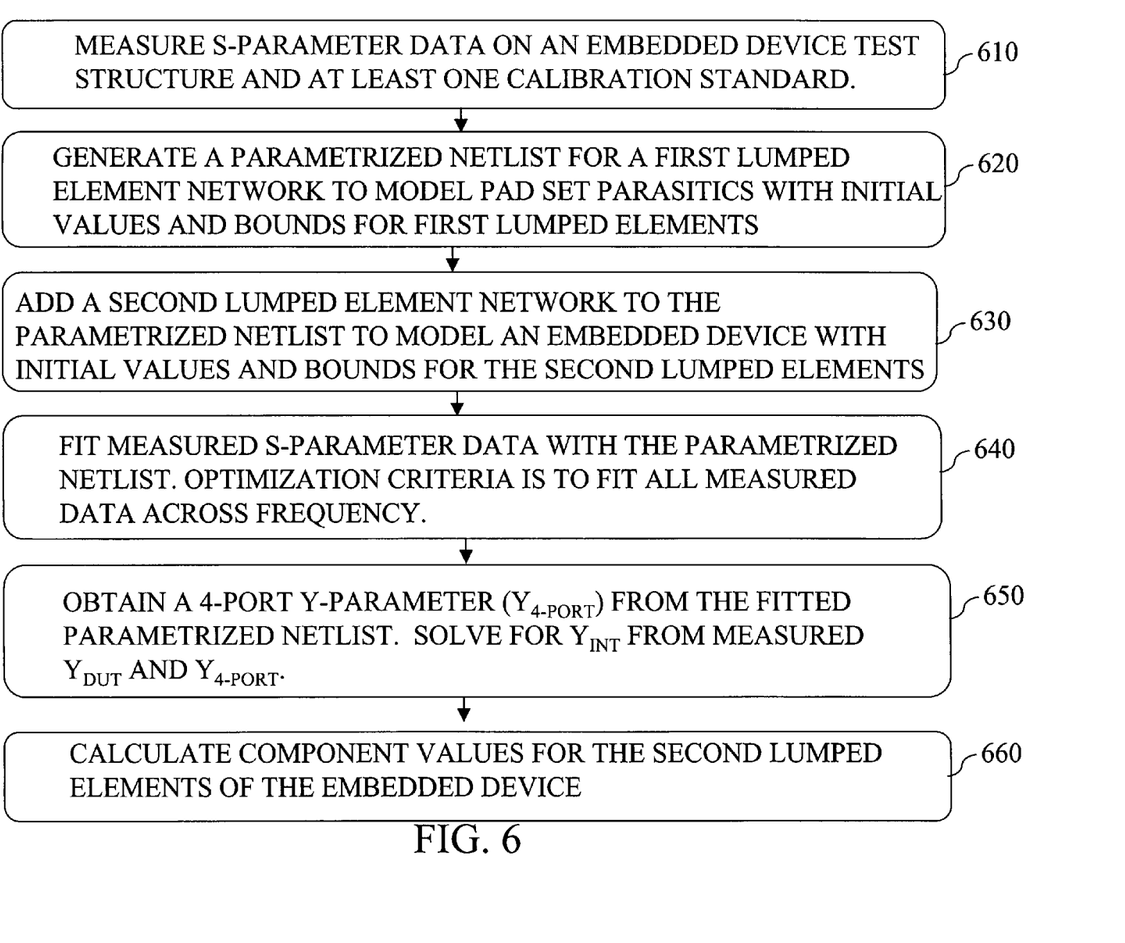
FIG. 6 is a flow chart illustrating a method for extracting a device parameter of a device under test (DUT) embedded in a device test structure (DTS) according to another aspect of the present invention.

FIG. 6 is a flow chart illustrating a method for extracting a device parameter of a device under test (DUT) embedded in a device test structure (DTS) according to a second embodiment of the present invention. Referring to step 610, scattering parameter (S-parameter) data is measured on the DTS that embeds the DUT and on at least one calibration standard as in step 510 of the flow chart in FIG. 5. Preferably, the at least one calibration standard includes the open dummy and the short dummy.

Referring to step 620, a parameterized netlist containing a lumped element network for the pad set parasitics of the DTS and representing the pad set parasitics of the DTS is generated as in step 520 of FIG. 5, i.e., the parameterized netlist is the same as in the first embodiment of the present invention described above. The parameterized netlist contains a first lumped element network that models the pad set parasitics of the DTS with at least one first parameterized lumped element. The first lumped element network of the second embodiment is the same as the lumped element network of the first embodiment. The at least one first parameterized lumped element of the second embodiment is the same as the at least one parameterized lumped element of the first embodiment.

Preferably, an initial value, a lower bound, and an upper bound are provided for each of the at least one first parameterized lumped element in the parameterized netlist for future fitting purposes. The parameterized netlist may contain constant lumped elements, i.e., lumped elements having a constant value for resistance, capacitance, or inductance. The at least one first parameterized lumped element may comprise a resistor having a parameterized frequency independent resistance value, a capacitor having a parameterized frequency independent capacitance value, and/or an inductor having a parameterized frequency independent inductance value. A constant lumped element, if present, may comprise a resistor having a constant frequency independent resistance value, a capacitor having a constant frequency independent capacitance value, and/or an inductor having a constant frequency independent inductance value.

Referring to step 630, a second lumped element network representing the DUT is added to the parameterized netlist. The second lumped element network contains at least one second parameterized lumped element. Thus, the parameterized netlist now contains the first lumped element network that models the pad set parasitics of the DTS and the second lumped element network that models the DUT. The added portion of the parameterized netlist may be a module that contains the second lumped element network. An exemplary module for the second lumped element network is shown below.

An exemplary module for the second lumped element network:
BEGIN DEVICE1
gm 4 5 3 5 0.15 0 1
cgg 4 5 40e-15 1e-15 100e-15
cdd 3 5 40e-15 1e-15 100e-15
gcgd 5 4 VCCAP 3 5 10e-15 1e-15 100e-15
gcdg 5 3 VCCAP 4 5 10e-15 1e-15 100e-15

Preferably, an initial value, a lower bound, and an upper bound are provided for each of the at least one second parameterized lumped element in the parameterized netlist for future fitting purposes. The second lumped element network portion of the parameterized netlist may contain some constant lumped elements, i.e., lumped elements having a constant value for resistance, capacitance, or inductance.

Referring to step 640, the measured S-parameter data from the DTS and the at least one calibration standard is fitted with the parameterized netlist employing the at least one first parameterized lumped element and the at least one second parameterized lumped element as fitting parameters. A generic algorithm for fitting data may be employed as in the first embodiment.

According to the present invention, the fitting is performed across all measurement frequencies. Thus, the collective set of the S-parameter data on the DTS and the at least one calibration standard across all measurement frequencies is fitted with the parameterized netlist. In principle, as long as the total number of independent measurement data points in the collective set of the S-parameter data exceeds the total number of the at least one first parameterized lumped element and the at least one second parameterized lumped element, a complete set of values may be obtained for all of the at least one first parameterized lumped element and the at least one second parameterized lumped element. Since the number of measurement frequencies may be increased without limit, a parameterized netlist having any positive integer for the total number of the at least one first parameterized lumped element and the at least one second parameterized lumped element may be fitted by increasing the number of measurement frequencies for the collective set of the S-parameter data on the DTS and the at least one calibration standard. In practice, the total number of the at least one first parameterized lumped element and the at least one second parameterized lumped element is optimized to facilitate fitting of the collective set of the S-parameter data on the DTS and the at least one calibration standard with a high confidence level.

The collective set of the S-parameter data on the DTS and the at least one calibration standard across all measurement frequencies is employed simultaneously for fitting of the at least one parameterized lumped element. Each of the at least one first parameterized lumped element and the at least one second parameterized lumped element is simultaneously fitted with the rest of the at least one first parameterized lumped element and the at least one second parameterized lumped element as the generic algorithm simultaneously fits the collective set of the S-parameter data. In other words, optimization criteria for the set of the at least one first parameterized lumped element and the at least one second parameterized lumped element is to fit all measured S-parameter data across all measured frequency. A computer program may be employed to obtain an optimal fitted value, or a fitted parameterized lumped element value, for each of the at least one parameterized lumped element the at least one first parameterized lumped element and the at least one second parameterized lumped element.

Referring to step 650, a 4-port Y-parameter for the first lumped element network of the pad set parasitics is calculated from the first lumped element network portion of the parameterized netlist and the set of at least one optimal fitted value for each of the at least one first parameterized lumped element. The first lumped element network has a fixed value, which is one of the optimal fitted values, for each of the first lumped components within the first lumped element network. Each of the constant lumped elements, if any is present, in the first lumped element network has a constant value for the resistance, capacitance, or inductance of the constant lumped element. Each of the at least one first parameterized lumped element in the first lumped element network has the optimal fitted value for the resistance, capacitance, or inductance of the parameterized first lumped element.

Thus, the values of all lumped components are known for the pad set parasitics that is represented by the first lumped element network portion of the parameterized netlist after the fitting of the collective set of the S-parameter data. The pad set parasitics may be represented by a frequency dependent formula for each component of the 4-port Y-parameter of the first lumped element network portion of the parameterized netlist, which is now provided with a fitted value for each of the first parameterized lumped element. Thus, each component of the 4-port Y-parameter for the pad set parasitics according to the present invention is given by an analytic function having frequency dependence that may be interpolated and extrapolated by an analytic function outside the range of measurement frequencies.

Referring to step 660, component values for the DUT is calculated from the second lumped element network portion of the parameterized netlist and the set of at least one optimal fitted value for each of the at least one second parameterized lumped element. The second lumped element network has a fixed value, which is one of the optimal fitted values, for each of the second lumped components within the first lumped element network. Each of the constant lumped elements, if any is present, in the second lumped element network has a constant value.

Thus, the values of all lumped components are known for the DUT that is represented by the first lumped element network portion of the parameterized netlist after the fitting of the collective set of the S-parameter data. The component values of the DUT may be represented by a frequency dependent formula. In other words, the component values of the DUT according to the present invention is given by an analytic function having frequency dependence that may be interpolated and extrapolated by an analytic function outside the range of measurement frequencies.

Figure 7:
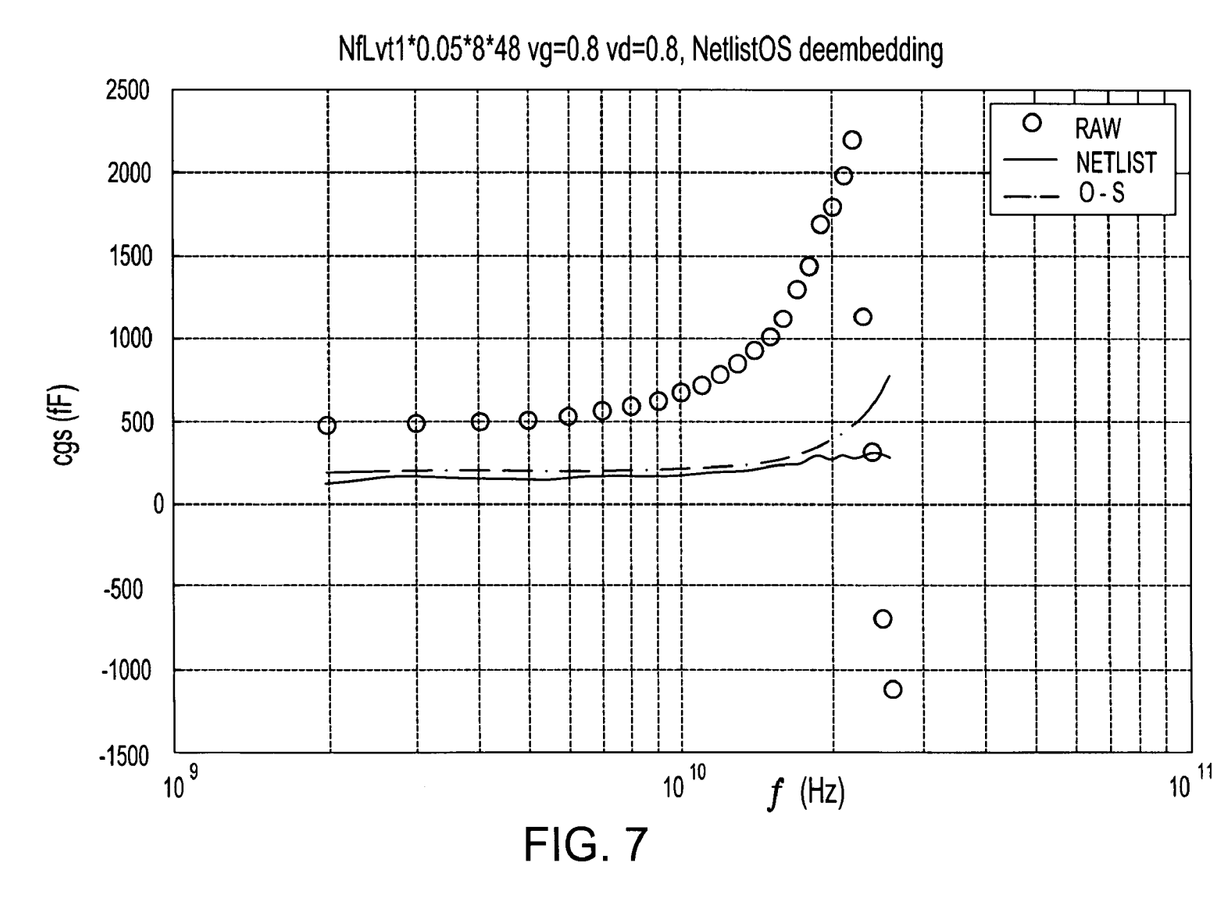
FIG. 7 is a graph comparing a raw data set for gate to source capacitance $C_{gs}$ of a semiconductor device as measured from a DTS, a first extracted data set for the gate to source capacitance $C_{gs}$ obtained by a prior art open-short (O-S) de-embedding method, a second extracted data set for the gate to source capacitance $C_{gs}$ obtained by an inventive de-embedding method according to the present invention.

Referring to FIG. 7, a graph compares a raw data set for gate to source capacitance $C_{gs}$ of a semiconductor device as measured from a DTS, a first extracted data set for the gate to source capacitance $C_{gs}$ obtained by a prior art open-short (O-S) de-embedding method, a second extracted data set for the gate to source capacitance $C_{gs}$ obtained by an inventive de-embedding method according to the present invention.

Theoretically, the gate to source capacitance $C_{gs}$ is constant. The raw data without de-embedding is not capable of providing a reliable value for the gate to source capacitance $C_{gs}$. Extracted discrete values (not shown) for the gate to source capacitance $C_{gs}$ according to open-short de-embedding is calculated each frequency at which measurement and calculation of 4-port Y-parameter are performed. The extracted discrete values according to the O-S de-embedding are represented by a dotted line. However, the value of the extracted gate to source capacitance $C_{gs}$ is not constant over a frequency range of concern, i.e., above 20 GHz. A solid curve obtained by the parameterized netlist based de-embedding method according to the present invention shows a more frequency independent gate to source capacitance $C_{gs}$. Thus, the present invention produces a superior result for the gate to source capacitance $C_{gs}$ than the prior art O-S de-embedding method.

Figure 8:
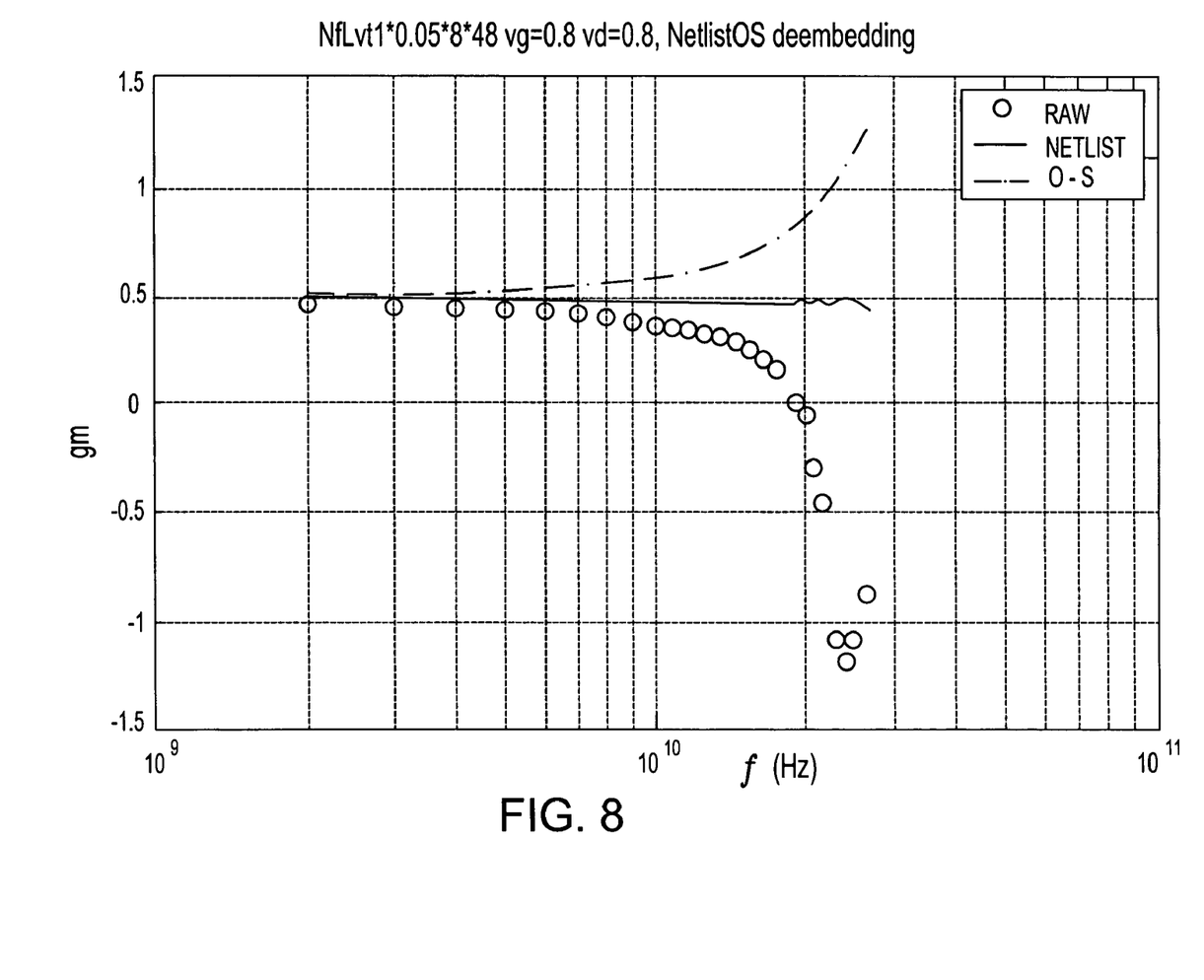
FIG. 8 is a graph comparing a raw data set for transconductance $g_m$ of a semiconductor device as measured from a DTS, a first extracted data set for the transconductance $g_m$ obtained by the prior art open-short (O-S) de-embedding method, a second extracted data set for the transconductance $g_m$ obtained by the inventive de-embedding method according to the present invention.

Referring to FIG. 8, a graph compares a raw data set for transconductance $g_m$ of a semiconductor device as measured from a DTS, a first extracted data set for the transconductance $g_m$ obtained by the prior art open-short (O-S) de-embedding method, a second extracted data set for the transconductance $g_m$ obtained by the inventive de-embedding method according to the present invention. Theoretically, the transconductance $g_m$ is constant. The raw data without de-embedding is not capable of providing a reliable value for the transconductance $g_m$. Extracted discrete values (not shown) for the transconductance $g_m$ according to open-short de-embedding is calculated each frequency at which measurement and calculation of 4-port Y-parameter are performed. The extracted discrete values according to the O-S de-embedding are represented by a dotted line. However, the value of the extracted transconductance $g_m$ is not constant over a frequency range of concern, i.e., above 20 GHz. A solid curve obtained by the parameterized netlist based de-embedding method according to the present invention shows a more frequency independent transconductance $g_m$. Thus, the present invention produces a superior result for the transconductance $g_m$ than the prior art O-S de-embedding method.

Figures 9A, 9B:
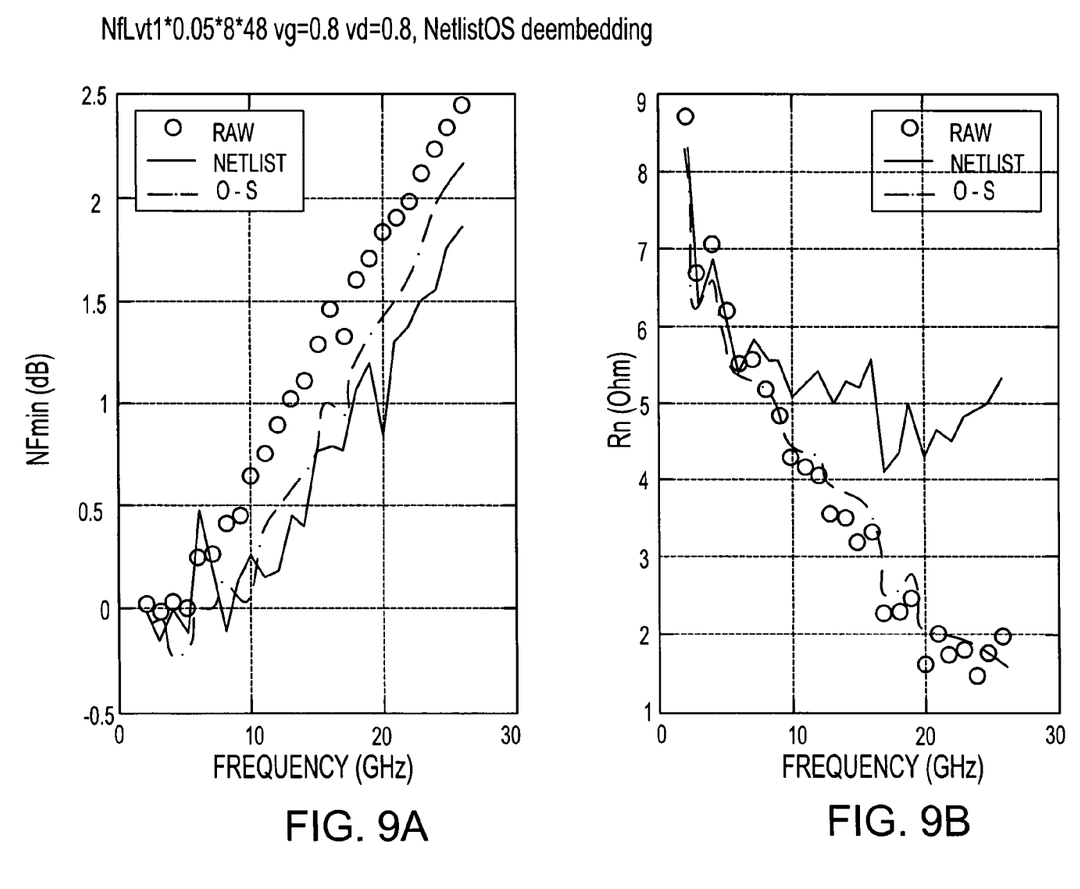
FIG. 9A is a graph comparing a raw data set for minimum noise figure $NF_{min}$ of a semiconductor device as measured from a DTS, a first extracted data set for the minimum noise figure $NF_{min}$ obtained by the prior art open-short (O-S) de-embedding method, a second extracted data set for the minimum noise figure $NF_{min}$ obtained by the inventive de-embedding method according to the present invention.
FIG. 9B is a graph comparing a raw data set for noise resistance $R_n$ of a semiconductor device as measured from a DTS, a first extracted data set for the noise resistance $R_n$ obtained by the prior art open-short (O-S) de-embedding method, a second extracted data set for the noise resistance $R_n$ obtained by the inventive de-embedding method according to the present invention.

Referring to FIGS. 9A and 9B, a graph comparing a raw data set for minimum noise figure $NF_{min}$ of a semiconductor device and the noise resistance $R_n$ of the semiconductor device are shown, respectively. The raw data as measured from a DTS is displayed as discrete data points represented by circles. The extracted discrete values for the minimum noise figure $NF_{min}$ and for the noise resistance R, that are obtained by the prior art open-short (O-S) de-embedding method are shown in dotted lines. Solid curves obtained by the parameterized netlist based de-embedding method according to the present invention show minimum noise figure $NF_{min}$ and noise resistance $R_n$ obtained by the inventive de-embedding method according to the present invention. While benefits of the inventive de-embedding method is not readily apparent in the graph for the minimum noise figure $NF_{min}$, the graph for the noise resistance $R_n$ makes it clear that the inventive method is capable of extracting a reliable value for the noise resistance $R_n$ at high frequencies above 10 GHz.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A system for extracting pad set parasitics from a device test structure (DTS), said system comprising:
said DTS embedding a device under test (DUT);
at least one calibration standard for said DUT;
scattering parameter (S-parameter) measurement means for measuring S-parameters of said DTS and said at least one calibration standard at multiple frequencies;
a parameterized netlist representing said pad set parasitics and containing a lumped element network having at least one parameterized lumped element;
S-parameter fitting means for fitting measured S-parameters of said DTS and said at least one calibration standard with said at least one parameterized lumped element;
4-port Y-parameter calculation means for calculating a 4-port Y-parameter of said parameterized netlist from a fitted parameterized lumped element value for each of said at least one parameterized lumped element; and
4-port de-embedding calculation means for extracting a 2-port Y-parameter of said DUT using said 4-port Y-parameter of the parameterized netlist.

2. The system of claim 1, wherein said S-parameter fitting means fits said measured S-parameters of said DTS and said at least one calibration standard at said multiple frequencies with said at least one parameterized lumped element.

3. The system of claim 2, wherein said at least one parameterized lumped element comprises at least one of a resistor, a capacitor, an inductor, a voltage source, and a current source.

4. The system of claim 3, wherein each of said at least one parameterized lumped element has a frequency independent resistance variable, a frequency dependent resistance variable, a frequency independent inductance variable, a frequency dependent inductance variable, a frequency independent capacitance variable, a frequency dependent capacitance variable, a frequency independent voltage variable, a frequency dependent voltage variable, a frequency independent current variable, a frequency independent current variable, a frequency independent transmission line variable, or a frequency dependent transmission line variable.

5. The system of claim 4, wherein an initial value, a lower bound, and an upper bound are provided for each of said at least one parameterized lumped element for said fitting of said measured S-parameters.

6. The system of claim 1, wherein said at least one calibration standard comprises an open dummy and a short dummy.

7. The system of claim 1, further comprising DUT Y-parameter calculation means for calculating a Y-parameter of said DUT based on said measured S-parameters of said DTS and said 4-port Y-parameter of said parameterized netlist.

8. The system of claim 1, wherein each of said S-parameter fitting means and said 4-port Y-parameter calculation means is a computer program.

9. The system of claim 1, wherein each component of said 4-port Y-parameter of said parameterized netlist is given by an analytic function having frequency dependence.

10. A system for extracting a device parameter of a device under test (DUT) embedded in a device test structure (DTS), said system comprising:
said DTS embedding said device under test (DUT);
at least one calibration standard for said DUT;
scattering parameter (S-parameter) measurement means for measuring S-parameters of said DTS and said at least one calibration standard at multiple frequencies;
a parameterized netlist containing a first lumped element network and a second lumped element network, wherein said first lumped element network represents pad set parasitics of said DTS and has at least one first parameterized lumped element, and wherein said second lumped element network represents said DUT and has at least one second parameterized lumped element;

S-parameter fitting means for fitting measured S-parameters of said DTS and said at least one calibration standard with said at least one first parameterized lumped element and said at least one second parameterized lumped element; and DUT parameter extraction means for calculating said device parameter from fitted parameterized lumped element values for each of said at least one first parameterized lumped element and said at least one second parameterized lumped element.

11. The system of claim 10, further comprising 4-port Y-parameter calculation means for calculating a 4-port Y-parameter of said parameterized netlist from fitted parameterized lumped element values for each of said at least one first parameterized lumped element and said at least one second parameterized lumped element.

12. The system of claim 11, wherein each component of said 4-port Y-parameter of said parameterized netlist is given by an analytic function having frequency dependence.

13. The system of claim 10, wherein said S-parameter fitting means fits said measured S-parameters of said DTS and said at least one calibration standard at said multiple frequencies with said at least one first parameterized lumped element and said at least one second parameterized lumped element.

14. The system of claim 13, wherein each of said at least one first parameterized lumped element and said at least one second parameterized lumped element comprises at least one of a resistor, a capacitor, an inductor, a voltage source, a current source, and transmission line.

15. The system of claim 14, wherein each of said at least one first parameterized lumped element and said at least one second parameterized lumped element has a frequency independent resistance variable, a frequency dependent resistance variable, a frequency independent inductance variable, a frequency dependent inductance variable, a frequency independent capacitance variable, a frequency dependent capacitance variable, a frequency independent voltage variable, a frequency dependent voltage variable, a frequency independent current variable, a frequency dependent current variable, a frequency independent transmission line variable, or a frequency dependent transmission line variable.

16. The system of claim 15, wherein an initial value, a lower bound, and an upper bound are provided for each of said at least one first parameterized lumped element and said at least one second parameterized lumped element for said fitting of said measured S-parameters.

17. The system of claim 10, wherein said at least one calibration standard.

18. The system of claim 10, wherein said DUT parameter extraction means calculates a Y-parameter of said DUT based on said measured S-parameters of said DTS and said fitted parameterized lumped element values.

19. A method for extracting pad set parasitics from a device test structure (DTS), said method comprising:
providing said DTS embedding a device under test (DUT);
providing at least one calibration standard for said DUT;
measuring S-parameters of said DTS and said at least one calibration standard at multiple frequencies;
generating a parameterized netlist representing said pad set parasitics and containing a lumped element network having at least one parameterized lumped element;
fitting measured S-parameters of said DTS and said at least one calibration standard with said at least one parameterized lumped element;
calculating a 4-port Y-parameter of said parameterized netlist from a fitted parameterized lumped element value for each of said at least one parameterized lumped element; and
calculating a 2-port Y-parameter of the DUT using said 4-port Y-parameter of said parameterized netlist.

20. A method for extracting a device parameter of a device under test (DUT) embedded in a device test structure (DTS), said method comprising:
providing said DTS embedding said device under test (DUT);
providing at least one calibration standard for said DUT;
measuring S-parameters of said DTS and said at least one calibration standard at multiple frequencies;
generating a parameterized netlist containing a first lumped element network and a second lumped element network, wherein said first lumped element network represents pad set parasitics of said DTS and has at least one first parameterized lumped element, and wherein said second lumped element network represents said DUT and has at least one second parameterized lumped element;
fitting measured S-parameters of said DTS and said at least one calibration standard with said at least one first parameterized lumped element and said at least one second parameterized lumped element; and
calculating said device parameter from fitted parameterized lumped element values for each of said at least one first parameterized lumped element and said at least one second parameterized lumped element.

* * * * *